(12) United States Patent
Uchiyama (10) Patent No.: US 6,489,645 B1
(45) Date of Patent: Dec. 3, 2002

(54) INTEGRATED CIRCUIT DEVICE INCLUDING A LAYERED SUPERLATTICE MATERIAL WITH AN INTERFACE BUFFER LAYER

(75) Inventor: Kiyoshi Uchiyama, Colorado Spring, CO (US)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/898,927

(22) Filed: Jul. 3, 2001

(51) Int. Cl.[7] .................. H01L 29/76; H01L 31/113; H01L 31/119
(52) U.S. Cl. ............ 257/295; 257/28; 257/9; 257/296; 257/751
(58) Field of Search ............ 257/295, 9, 28, 257/751, 296

(56) References Cited

U.S. PATENT DOCUMENTS

| | | | |
|---|---|---|---|
| 5,439,845 A | | 8/1995 | Watanabe et al. |
| 5,519,234 A | | 5/1996 | Paz de Araujo et al. |
| 5,708,302 A | * | 1/1998 | Azuma et al. ............ 257/751 |
| 5,719,416 A | * | 2/1998 | Yoshimori et al. ......... 257/295 |
| 5,780,886 A | | 7/1998 | Yamanobe et al. |
| 5,784,310 A | | 7/1998 | Cuchiaro et al. |
| 6,194,227 B1 | * | 2/2001 | Hase ........................ 438/3 |
| 6,265,738 B1 | * | 7/2001 | Hayashi et al. .......... 257/295 |

OTHER PUBLICATIONS

Yamawaki et al., "Ultra Thin SrBi2Ta2O9 Ferroelectric Films Grown By Liquid Source CVD Using BiOx Buffer Layers," Extended Abstracts Of The 1998 International Conference On Solid State Devices And Materials, pp. 102–103 (1998).

* cited by examiner

Primary Examiner—David Nelms
Assistant Examiner—Tu-Tu Ho
(74) Attorney, Agent, or Firm—Patton Boggs LLP (57) ABSTRACT

An integrated circuit memory device includes a thin film layered superlattice material layer and an electrode. An interface buffer layer is formed between said thin film layered superlattice material layer and said electrode. The interface buffer layer is selected from the group consisting of: 1) simple oxides, not including bismuth, of an A-site or a B-site metal; and 2) second layered superlattice materials different from the first layered superlattice material and containing at least one A-site or B-site metal that is the same as an A-site or B-site metal in the first layered superlattice material. The oxide not including bismuth can be a complex oxide including a plurality of metals or a simple oxide including only one metal. Most preferably, the interface buffer layer is selected from the group consisting of strontium tantalate, bismuth tantalate, strontium niobium tantalate, strontium bismuth tantalate niobate, titanium oxide, and tantalum pentoxide, other simple oxides of A-site and B-site metals, and other simple oxides of one or more A-site or B-site metals.

24 Claims, 3 Drawing Sheets

INTEGRATED CIRCUIT DEVICE INCLUDING A LAYERED SUPERLATTICE MATERIAL WITH AN INTERFACE BUFFER LAYER

BACKGROUND OF THE INVENTION

1. Field of the Invention

The present invention pertains to the field of thin films for use in integrated circuits, and particularly thin film layered superlattice materials. More specifically, a specialized interface buffer layer enhances the performance of thin film layered superlattice materials.

2. Statement of the Problem

Ferroelectric materials are characterized by their ability to retain an induced polarization state even in the absence of an applied electric field. If the polarization state in one direction is identified as a logic "0" polarization state and the polarization state in the opposite direction is identified as a logic "1" polarization state, and appropriate circuitry is provided to sense the polarization state, a ferroelectric material can be used as the information storage medium of a high speed nonvolatile computer memory. It is known that such ferroelectric memory device can be made by substituting a ferroelectric material for the dielectric capacitor material of a conventional DRAM capacitor circuit and making appropriate changes in the read and write circuits and manufacturing processes to utilize the ferroelectric film as the information storage medium. See, for example, U.S. Pat. No. 5,784,310 issued Jul. 21, 1998 to Cuchiaro et al. This substitution converts the DRAM cell to a nonvolatile memory cell due to long-term retention of an induced polarization state in the ferroelectric material even in the absence of an applied field. It is also possible to make a ferroelectric memory cell consisting of a single field effect transistor due to the nonvolatile polarization state of ferroelectric thin films, as described in U.S. Pat. No. 5,780,886 issued to Yamanobe et al.

A problem arising in the use of ferroelectric memory devices is that point charge defects at the thin film layered superlattice material layer surfaces have the effect of screening the applied field due to the presence of induced charge at the thin film surface creating a field opposite to the applied field. Thus, some of the interior ferroelectric domains of the crystal are never exposed to a field having sufficient magnitude to completely polarize the domains. The polarization performance of the ferroelectric memory devices suffer as a result of this field screening.

The most serious problems associated with screening, i.e., ferroelectric fatigue, leakage, and imprint problems, can be largely overcome through the use of layered thin film superlattice materials, as reported in U.S. Pat. No. 5,784,310 issued Jul. 21, 1998 to Cuchiaro et al. Ferroelectric perovskite-like layered thin film superlattice materials are a known class of self-ordering crystals, and have been used in thin films suitable for use in integrated circuits, e.g., as reported in U.S. Pat. No. 5,519,234 issued May 21, 1996 to Araujo et al. The term "perovskite-like" usually refers to a number of interconnected oxygen octahedra. A primary cell is typically formed of an oxygen octahedral positioned within a cube that is defined by large A-site metals where the oxygen atoms occupy the planar face centers of the cube and a small B-site element occupies the center of the cube. In some instances, the oxygen octahedra may be preserved in the absence of A-site elements.

The thin film layered superlattice materials layers are characterized by an ability to find thermodynamic stability in layered structures. Disordered solutions of superlattice-forming metals, when exposed to thermal treatments, spontaneously form a single layered superlattice material compound having intercollated layers of perovskite-like octahedrons and a superlattice generator such as bismuth oxide. The resultant self-ordered structure forms a superlattice by virtue of a dual periodicity corresponding to the repeated layers. The layered thin film superlattice materials have this self-ordering ability and, consequently, are distinct from semiconductor heterolattices which require the deposition of each layer in a separate deposition step.

The thin film layered superlattice materials, while much superior than prior art materials, still present problems relating to integration into conventional integrated circuit processes. For example, crystallization of the best of the layered superlattice materials require high temperatures that can damage conventional integrated circuit components such as wiring layers and semiconductors. In addition, diffusion of chemical elements between these materials and conventional integrated circuit materials degrades both the layered materials and the conventional materials. Further, the interfaces between the layered superlattice materials and conventional integrated circuit materials are often problematic: evaporation of highly volatile elements of the layered superlattice material, such as bismuth, can create deficiency of the volatile element in the layered superlattice material, leading to defects. Screening, surface roughness, and adhesion problems can also occur at these interfaces. Because of such problems, current ferroelectric memories are usually made with the ferroelectric material isolated from the conventional materials by a thick layer of an insulator. This, of course, increases the bulk of the memory and decreases the density of the memory.

Bismuth oxide and $Sr_3Bi_2O_6$ buffer layers between the layered superlattice materials and the conventional integrated circuit components have been proposed as a solution to the bismuth deficiency problem. See H. Yamawaki, S. Miyagaki, T. Eshita and Y. Arimoto, "Ultra Thin $SrBi_2Ta_2O_9$ Ferroelectric Films Grown By Liquid Source CVD Using BiOx Buffer Layers, in *Extended Abstracts of the 1998 Inter. Conf. on Solid State Devices and Materials*, 1998, pp. 102–103 and U.S. Pat. No. 6,194,227 B1 issued Feb. 27, 2001 to Takashi Hase. While analysis of the material has shown that such buffer layers solve the bismuth deficiency problem, the other problems mentioned above remained, and the electrical properties of the layered superlattice materials made with such buffer layers were not significantly improved.

It is also known that the polarizability of layered thin film superlattice materials is reduced if stoichiometric precursors are used, since some elements, such as bismuth, are more volatile and are disproportionately removed from the materials during drying and annealing. Therefore, precursors using excess amounts of these volatile elements are often used so that, after drying and annealing, the resulting material is approximately stoichiometric. Bismuth gradients have also been used to obtain essentially stoichiometric final layered superlattice materials. See, for example, U.S. Pat. No. 5,439,845 issued Aug. 8, 1995 to Watanabe et al. While the devices using a gradient show enhanced polarizability, they also must be relatively thick because of the multiple layers, resulting in lower density of the thin film superlattice material memory.

There remains a need to obtain greater residual polarization values and improve the interface between the thin film superlattice material layers and the conventional materials. The solution of these problems will result in increasing the density of thin film superlattice material memories and other integrated circuits that contain thin film superlattice materials as well as more reliable memories.

SOLUTION

The present invention advances the art and overcomes the aforementioned problems by providing improved thin film ferroelectric devices having an enhanced magnitude of residual polarization. These improvements derive from the use of an interface buffer layer between the electrode and the thin film superlattice material layer. An integrated circuit memory device according to the invention includes a substrate supporting a thin film superlattice material layer. The thin film superlattice material layer is "interfaced" on one or both the top and bottom side by an interface buffer layer. Preferably, the interface buffer layer is a non-ferroelectric material. An interface buffer layer is preferably placed directly on top of the bottom electrode or directly below the top electrode, or both. The interface buffer layer is preferably at least 3 nanometers (nm) thick, and preferably resides in direct contact with both the electrode and the first thin film superlattice material layer. Preferably, the interface buffer layer is selected from the group consisting of: 1) simple oxides, not including bismuth, of an A-site or a B-site metal; and 2) second layered superlattice materials different from the first layered superlattice material and containing at least one A-site or B-site metal that is the same as an A-site or B-site metal in the first layered superlattice material. Here, a "simple oxide" is an oxide that does not have a layered structure, but rather has a crystalline structure consisting of a single repeated unit cell. The simple oxide not including bismuth can be one including a plurality of metals or one including only one metal. Most preferably, the interface buffer layer is selected from the group consisting of strontium tantalate, bismuth tantalate, strontium niobium tantalate, strontium bismuth tantalate niobate, titanium oxide, and tantalum pentoxide, other simple oxides of A-site and B-site metals, and other simple oxides of one or more A-site or B-site metals. "Different" within the above context means that either the chemical elements or the stoichiometry with respect to the A-site and B-site elements is different in the second layered superlattice material as compared to the first layered superlattice material. "Different" does not include the situation in which the amount of bismuth or other layered superlattice generator material is the only difference.

The interface buffer layer preferably ranges from 3 nm to 30 nm in thickness, with the most preferred thicknesses ranging from 5 nm to 20 nm to provide adequate defect compensation while being thin enough to avoid significant problems with parasitic capacitance.

The invention provides an integrated circuit device including a substrate supporting a first thin film layered superlattice material layer and an electrode, comprising an interface buffer layer interposed between the thin film layered superlattice material layer and the electrode, the interface buffer layer selected from the group consisting of: simple oxides, not including bismuth, of an A-site or a B-site metal; and second layered superlattice materials different from the first layered superlattice material and containing at least one A-site or B-site metal that is the same as an A-site or B-site metal in the first layered superlattice material. Preferably, the interface buffer layer is selected from the group consisting of: strontium tantalate, bismuth tantalate, strontium niobium tantalate, strontium bismuth tantalate niobate, titanium oxide, and tantalum pentoxide, other simple oxides of A-site and B-site metals, and other simple oxides of one or more A-site or B-site metals. Preferably, the interface buffer layer comprises strontium tantalate, bismuth tantalate, strontium niobium tantalate, titanium oxide, or tantalum pentoxide and the layered superlattice material comprises strontium bismuth tantalate, strontium bismuth niobium tantalate, bismuth titanate, or bismuth lanthanum titanate. Preferably, the first layered superlattice material comprises strontium bismuth tantalum niobate or strontium bismuth tantalate, and the second layered superlattice material comprises strontium bismuth tantalum niobate in which the amount of niobium exceeds the amount of niobium in the first layered superlattice material.

The invention also provides a method of making an integrated circuit memory device, the method comprising the steps of: depositing a first electrode layer on a substrate; depositing a first interface buffer layer on the substrate, the first interface buffer layer selected from the group consisting of: simple oxides, not including bismuth, of an A-site or a B-site metal; and layered superlattice materials; and depositing a thin film layered superlattice material layer adjacent to the thin film interface buffer layer, the thin film layered superlattice material layer being a different material than the first interface buffer layer material and containing at least one A-site or B-site metal that is the same as an A-site or B-site metal in the first interface buffer layer material. Preferably, the first interface buffer layer is selected from the group consisting of: strontium tantalate, bismuth tantalate, strontium niobium tantalate, strontium bismuth tantalate niobate, titanium oxide, and tantalum pentoxide, other simple oxides of A-site and B-site metals, and other simple oxides of one or more A-site or B-site metals.

The invention further provides a method of making an integrated circuit memory device, the method comprising the steps of: depositing an electrode layer on the substrate; with the substrate in a deposition chamber, depositing a first interface buffer layer on the substrate, the interface buffer layer selected from the group consisting of simple oxides, not including bismuth, of an A-site or a B-site metal; and without removing the substrate from the deposition chamber, switching on a superlattice generator metal source supply to deposit a thin film layered superlattice material layer including the superlattice generator metal adjacent to the thin film layered superlattice material layer. Preferably, the method further includes the step of switching off the superlattice generator metal source supply to deposit a second interface buffer layer on the thin film layered superlattice material layer, the interface buffer layer selected from the group consisting of simple oxides, not including bismuth, of an A-site or a B-site metal; and depositing an electrode layer adjacent the interface buffer layer.

In addition, the invention provides a method of making an integrated circuit memory device, the method comprising the steps of: depositing a first electrode layer on a substrate; depositing a first interface buffer layer on the substrate, the first interface buffer layer selected from the group consisting of strontium tantalate, bismuth tantalate, strontium niobium tantalate, strontium bismuth tantalate niobate, titanium oxide, and tantalum pentoxide, other simple oxides of A-site and B-site metals, and other simple oxides of one or more A-site or B-site metals; baking the integrated circuit device at a soft bake temperature; depositing a thin film layered superlattice material layer adjacent the interface buffer layer, the thin film layered superlattice material layer selected from the group consisting of strontium bismuth tantalate, strontium bismuth niobate, strontium bismuth niobium tantalate, bismuth titanate, and bismuth lanthanum titanate; baking the integrated circuit device at a soft bake temperature; and annealing one or more of the layers. Preferably, the method also includes the steps of: depositing a second interface buffer layer adjacent the thin film superlattice material layer, the second interface buffer layer selected from the group consisting of strontium tantalate, bismuth tantalate, strontium niobium tantalate, strontium bismuth tantalate niobate, titanium oxide, and tantalum pentoxide, other simple oxides of A-site and B-site metals, and other simple oxides of one or more A-site or B-site metals; baking the integrated circuit device at a soft bake temperature; and depositing a second electrode adjacent the second interface buffer layer.

The invention also provides a method of making an integrated circuit memory device, the method comprising the steps of: depositing a first electrode layer on a substrate; depositing a first interface buffer layer on the substrate, the first interface buffer layer comprising strontium bismuth tantalum niobate; depositing a thin film layered superlattice material layer adjacent the interface buffer layer, the thin film layered superlattice material layer comprising strontium bismuth tantalate or strontium bismuth tantalum niobate having a lesser amount of niobium than said first interface buffer layer; and annealing the integrated circuit device at a crystallization temperature lower than the crystallization temperature of the layered superlattice material layer without the first interface buffer layer. Preferably, the method further includes the steps of: depositing a second interface buffer layer adjacent the thin film superlattice material layer, the interface buffer layer selected from the group consisting of strontium tantalate, bismuth tantalate, strontium niobium tantalate, strontium bismuth tantalate niobate, titanium oxide, and tantalum pentoxide, other simple oxides of A-site and B-site metals, and other simple oxides of one or more A-site or B-site metals; depositing a second electrode layer adjacent the interface buffer layer; and annealing one or more of the layers. Preferably, the second interface buffer layer comprises strontium bismuth tantalum niobate having a higher concentration of niobium than the thin film layered superlattice material. Preferably, the strontium bismuth tantalate crystallization temperature ranges from 550° C. to 750° C.

The use of the interface buffer layer appears to prevent field screening by providing a transition from the ferroelectric to the conductor. It permits very thin film superlattice material devices with excellent ferroelectric properties. Numerous other features, objects and advantages of the invention will become apparent from the following description when read in conjunction with the accompanying drawings.

DETAILED DESCRIPTION OF THE PREFERRED EMBODIMENT

Figure 1:
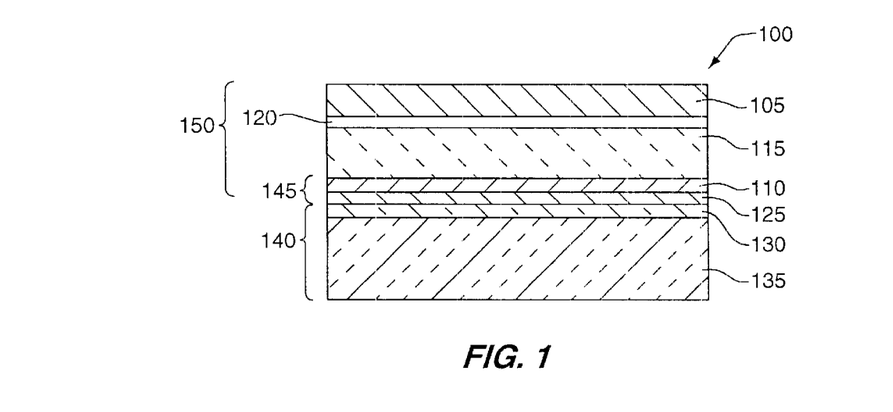
FIG. 1 depicts an integrated circuit memory device according to the invention with an interface buffer layer atop a thin film layered superlattice material layer and beneath a top electrode.

FIG. 1 s a first embodiment of the invention, wherein the interface buffer layer 120 is located adjacent to and below the upper metal electrode 105 of the integrated circuit memory device 100 and adjacent to and above the thin film layered superlattice material layer 115 of the integrated circuit memory device 100. The thin film layered superlattice material layer 115 is adjacent to and above the lower electrode 145. The lower electrode 145 comprises an adhesion metal layer 125 and a metal electrode layer 110. The integrated circuit memory device 100 also comprises a substrate 140. The substrate 140 comprises an insulating layer 130 and a semiconducting wafer 135. Herein, the term "substrate material layer" is in a general sense applied to any layer or combination of layers providing support for yet another layer. For example, the substrate 140 for ferroelectric capacitor 150 is immediately the insulating layer 130, but also can be broadly interpreted to include the semiconducting wafer 135 and the combination of semiconducting wafer 135 with insulating layer 130. As is conventional in the art, we shall also refer to the device in various states of completion as a substrate, which is intended to include all of the layers completed up to the point of time in reference.

Terms of orientation, such as "above", "top", "upper", "below", "bottom", and "lower" herein mean relative to the wafer 135 in FIGS. 1–3. That is, if a second element is "above" a first element, it means it is farther from the semiconducting wafer 135; and if it is "below" another element, then it is closer to the semiconducting wafer 135 than the other element. The long dimension of semiconducting wafer 135 defines a plane that is considered to be a "horizontal" plane herein, and directions perpendicular to this plane are considered to be "vertical".

The term "thin film" herein means a thin film of a thickness appropriate to be used in an integrated circuit. Such thin films are less than 1 micron in thickness, and generally are in the range of 2 nanometers (nm) to 500 nm. It is important to distinguish this term from the same term, i.e., "thin film", as used in essentially macroscopic arts, such as optics, where "thin film" means a film over 1 micron, and usually from 2 to 100 microns. Such macroscopic "thin films" are hundreds to thousands of times thicker than integrated circuit "thin films", and are made by entirely different processes that generally produce cracks, pores and other imperfections that would be ruinous to an integrated circuit but are of no consequence in optics and other macroscopic arts.

Ferroelectric capacitor 150 contains a bottom metal electrode layer 110. The bottom metal electrode layer 110 can be any metal or electrode structure suitable for use in integrated circuits, e.g., aluminum, gold, ruthenium, rhodium, and palladium. Bottom electrode 145 is preferably made of a combination of a bottom metal electrode layer 110 comprising platinum and adhesion metal layer 125 comprising titanium where titanium functions as an adhesion metal to prevent peeling of the platinum component away from the oxide layer. Tantalum, iridium and iridium oxide are also useful as adhesion metals. The titanium or other adhesion metal layer 125 is typically sputtered to a thickness ranging from 10 nm to 20 nm. The platinum or bottom metal electrode layer 110 preferably ranges from 100 nm to 200 nm thick. The bottom metal electrode layer 110 is formed by conventional atomic sputtering techniques, such as DC magnetron sputtering or radio frequency sputtering.

A thin film layered superlattice material layer 115 resides atop bottom electrode 145. Thin film layered superlattice material layer 115 is preferably a metal oxide having a high dielectric constant and ferroelectric properties. Thin film layered superlattice material layer 115 is fabricated as described in detail below and is preferably less than about 400 nm thick, and most preferably less than about 200 nm thick. Thin film layered superlattice material layer 115 is preferably a layered superlattice material containing bismuth, and is most preferably a mixed layered superlattice material.

The term "perovskite" herein refers to a known class of material having the general form $ABO_3$, where A and B are cations and O is an oxygen anion component. This term is intended to include materials where A and B represent multiple elements; for example, it includes materials of the form $A'A''BO_3$, $AB'B''O_3$, and $A'A''B'B''O_3$, where A', A''B' and B'' are different metal elements. Preferably, A, A', and A'' are metals selected from the group of metals consisting of Ba, Bi, Sr, Pb, Ca, and La; and B, B', and B'' are metals selected from the group consisting of Ti, Zr, Ta, Mo, W, and Nb. The terms "A-site" and "B-site" refer to specific positions in the perovskite oxygen octahedral lattice.

Many layered superlattice materials have a plurality of perovskite-like oxygen octahedron layers separated by a corresponding number of bismuth oxide layers. Layered superlattice materials are typically ferroelectric materials, though not all such materials may exhibit ferroelectric behavior at room temperature. These materials normally have high dielectric constants, and are useful in high dielectric constant capacitors, whether or not they are ferroelectric. The terms "A-site" and "B-site", when used in connection with the layered superlattice materials of the invention, refer to specific locations within the oxygen octahedral layers.

All types of layered superlattice materials may be generally summarized under the average empirical formula:

Note that Formula (1) refers to a stoichiometrically balanced list of superlattice-forming moieties. Formula (1) does not represent a unit cell construction, nor does it attempt to allocate ingredients to the respective layers. In Formula (1), A1, A2 . . . Aj represent A-site elements in a perovskite-like octahedral structure, which includes elements such as strontium, calcium, barium, bismuth, lead, and mixtures thereof, as well as other metals of similar ionic radius. S1, S2 . . . Sk represent superlattice generator elements, which preferably include only bismuth, but can also include trivalent materials such as yttrium, scandium, lanthanum, antimony, chromium, and thallium. B1, B2 . . . Bl represent B-site elements in the perovskite-like structure, which may be elements such as titanium, tantalum, hafnium, tungsten, niobium, vanadium, zirconium, and other elements; and Q represents an anion, which preferably is oxygen but may also be other elements, such as fluorine, chlorine and hybrids of these elements, such as the oxyfluorides, the oxychlorides, etc. The superscripts in Formula (1) indicate the valences of the respective elements. The subscripts indicate the number of atoms of a particular element in the empirical formula compound. In terms of the unit cell, the subscripts indicate a number of atoms of the element, on the average, in the unit cell. The subscripts can be integer or fractional. That is, Formula (1) includes the cases where the unit cell may vary throughout the material, e.g., in $Sr_{0.75}Ba_{0.25}Bi_2Ta_2O_9$, where, on the average, 75% of the time Sr is the A-site atom and 25% of the time Ba is the A-site atom. If there is only one A-site element in the compound, then it is represented by the "A1" element, and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although Formula (1) is written in the more general form because the invention is intended to include the cases where either of the A- and B-sites and the superlattice generator can have multiple elements. The value of z is found from the equation:

$$(a1w1+a2w2 \ldots +ajwj)+(s1x1+s2x2 \ldots +skxk)+(b1y1 +b2y2 \ldots +b1y1)=2z. \tag{2}$$

The layered superlattice materials by definition do not include every material that can be fit into Formula (1), but only those ingredients which spontaneously form themselves into a layer of distinct crystalline layers during crystallization. This spontaneous crystallization is typically assisted by thermally treating or annealing the mixture of ingredients. The enhanced temperature facilitates ordering of the superlattice-forming moieties into thermodynamically favored structures, such as perovskite-like octahedrons.

The term "superlattice generator elements" as applied to S1, S2 . . . Sk, refers to the fact that these metals are particularly stable in the form of a concentrated metal oxide layer interposed between two perovskite-like layers, as opposed to a uniform random distribution of superlattice generator metals throughout the mixed layered superlattice material. In particular, bismuth has an ionic radius that permits it to function as either an A-site material or a superlattice generator; but bismuth, if present in amounts less than a threshold stoichiometric proportion, will spontaneously concentrate as a non-perovskite-like bismuth oxide layer.

The term "layered thin film superlattice material" herein also includes doped layered superlattice materials. That is, any of the material included in Formula (1) may be doped with a variety of materials, such as silicon, germanium, uranium, zirconium, tin, chromium, dysprosium, or hafnium.

Formula (1) at least includes all three of the Smolenskii-type ferroelectric layered superlattice materials; namely, those having the respective empirical formulae:

wherein A is an A-site metal in the perovskite-like superlattice, B is a B-site metal in the perovskite-like superlattice, S is a trivalent superlattice-generator metal such as bismuth or thallium, and m is a number sufficient to balance the overall formula charge. Where m is a fractional number, the overall average empirical formula provides for a plurality of different or mixed perovskite-like layers wherein the respective layers have different thicknesses of perovskite-like oxygen octahedrons.

In a first embodiment of the present invention, an upper interface buffer layer 120 is formed atop thin film layered superlattice material layer 115. Upper interface buffer layer 120 is used to compensate point charge defects in the upper surface of thin film layered superlattice material layer 115 and also results in a smoother interface with the electrode 105. In the preferred applications, the upper interface buffer layer 120 is preferably an oxide of an A-site or B-site metal. The oxide can be one including a plurality of metals or one including only one metal. The oxide does not include bismuth, but can include both an A-site and a B-site metal. The upper interface buffer layer can also preferably be a second layered superlattice material different from the first layered superlattice material 115 but including at least one A-site or B-site element in common with the layered superlattice material 115. "Different" within the above context means that either the chemical elements or the stoichiometry with respect to the A-site and B-site elements is different in the second layered superlattice material as compared to the first layered superlattice material. "Different" does not include the situation in which the amount of bismuth or other layered superlattice generator material is the only difference.

Most preferably, the interface buffer layer material is selected from the group consisting of strontium tantalate, bismuth tantalate, strontium niobium tantalate, strontium bismuth tantalate niobate, titanium oxide, and tantalum pentoxide, other simple oxides of A-site and B-site metals, and other simple oxides of one or more A-site or B-site metals. Here, "simple oxide" means an oxide having a crystal structure that includes only a single unit cell that repeats. That is, a "simple oxide" does not include any of the layered materials. The preferred thickness of the interface buffer layer is at least 3 nm, and preferably ranges from 3 nm to 30 nm, with the most preferred thickness ranging from 5 nm to 20 nm. The best results are obtained with thicknesses of 10 nm. Interface buffer layers thicker than about 30 nm may result in a parasitic capacitance due to the dielectric behavior of the interface buffer material with associated screening of the applied field in a deleterious manner similar to screening of the field by charge defects.

In some circumstances, upper interface buffer layer 120 is thin enough to diffuse into the thin film layered superlattice material layer 115. Similarly, thin film layered superlattice material layer 115 may diffuse into upper interface buffer layer 120 or the layers may interdiffuse.

A top electrode 105 is typically about 100 nm to 200 nm thick, and is usually made of the same metal or electrode structure as the bottom electrode 145, except titanium or other adhesion metal is normally not needed. Top electrode 105 may also have a different structure or be made of a different metal than bottom electrode 145.

As is known in the art, the integrated circuit memory device 100 may include other conventional layers, such as diffusion barrier layers. Many other materials may be used for any of the layers discussed above, such as silicon nitride for insulating layer 130; gallium arsenide, indium antimonide, magnesium oxide, strontium titanate, sapphire or quartz for semiconducting wafer 135; and many other adhesion layers, barrier layers, and electrode materials. Bottom electrode 145 may be eliminated, in which case the integrated circuit memory device 100 is no longer a ferroelectric capacitor 150, and becomes useful as a 1T or transistor gate in what is known as a metal-ferroelectric-insulator-semiconductor cell. Further, it should be understood that FIG. 1 is not meant to be an actual cross-sectional view of any particular portion of an actual electronic device, but is merely an idealized representation which is employed to more clearly and fully depict the structure and process of the invention than would otherwise be possible. For example, the relative thicknesses of the individual layers are not depicted proportionately, since otherwise some layers, such as the semiconducting wafer 135 or insulating layer 125, would be so thick as to make the drawing unwieldy.

Figure 2:
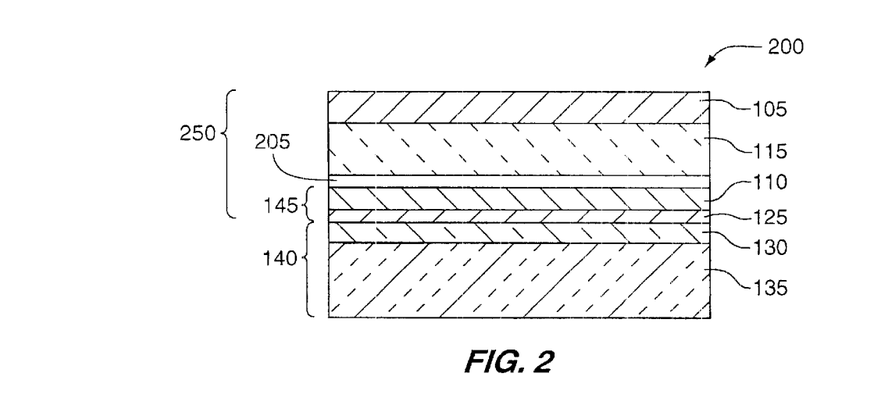
FIG. 2 depicts an integrated circuit memory device according to the invention with an interface buffer layer beneath a thin film layered superlattice material layer and above a bottom electrode.

A second embodiment of the present invention, second integrated circuit memory device 200, is shown in FIG. 2. In FIG. 2, like numbering of identical components has been retained with respect to FIG. 1. Integrated circuit memory device 200 contains a ferroelectric capacitor 250 that differs from ferroelectric capacitor 150 by the addition of a lower interface buffer layer 205 interposed between thin film layered superlattice material layer 115 and bottom electrode 145. Upper interface buffer layer 120 is absent in the FIG. 2 embodiment, but upper interface buffer layer 120 could also be included in place between top electrode 105 and thin film layered superlattice material layer 115. Lower interface buffer layer 205 is preferably made of one of the materials discussed above with respect to upper interface buffer layer 120.

Figure 3:
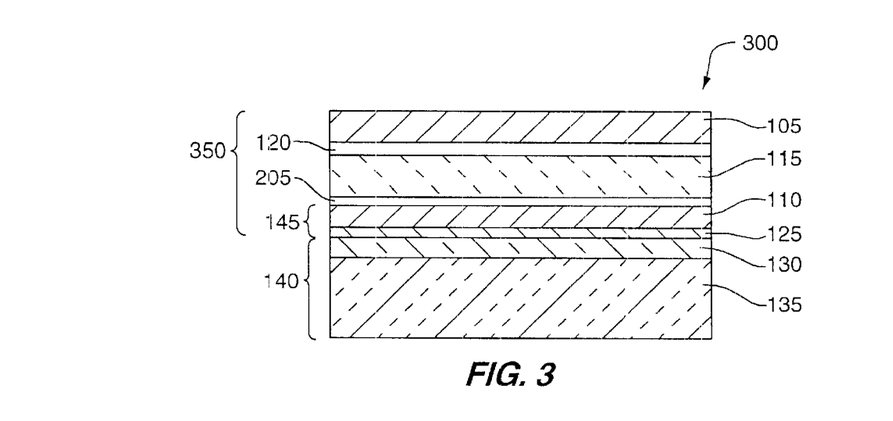
FIG. 3 depicts an integrated circuit memory device according to the invention with an interface buffer layer beneath and atop a thin film layered superlattice material layer.

FIG. 3 depicts a third embodiment of an integrated circuit memory device 300 according to the invention. In FIG. 3, like numbering of identical components has been retained with respect to FIGS. 1 and 2. Integrated circuit memory device 300 contains a ferroelectric capacitor 350 that differs from ferroelectric capacitors 150 and 250 in that ferroelectric capacitor 350 incorporates both an upper interface buffer layer 120 and a lower interface buffer layer 205. Upper interface buffer layer 120 is located adjacent and below the upper electrode 105 and adjacent and above the thin film layered superlattice material layer 115. Lower interface buffer layer 205 is located adjacent and above the bottom electrode 145 and adjacent and below the thin film layered superlattice material layer 115.

The interface buffer layers 120 and 205 may be produced from sputtered metal that is oxidized in an anneal, the oxidized metal may itself be sputtered, or the layers may be produced from spin-on liquid precursors; such as sol-gels (metal alkoxides), metal carboxylates or metal alkoxycarboxylate solutions. Misted liquid deposition or chemical vapor deposition may also be used.

Figure 4:
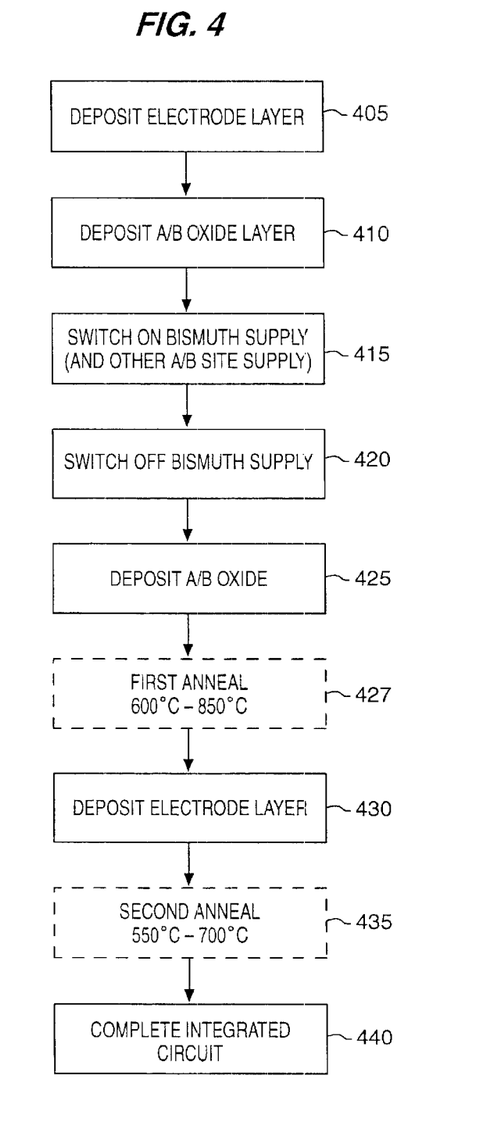
FIG. 4 is a flow diagram depicting an exemplary method for depositing an interface buffer layer and a thin film layered superlattice material layer according to an embodiment of the invention.
Figure 5:
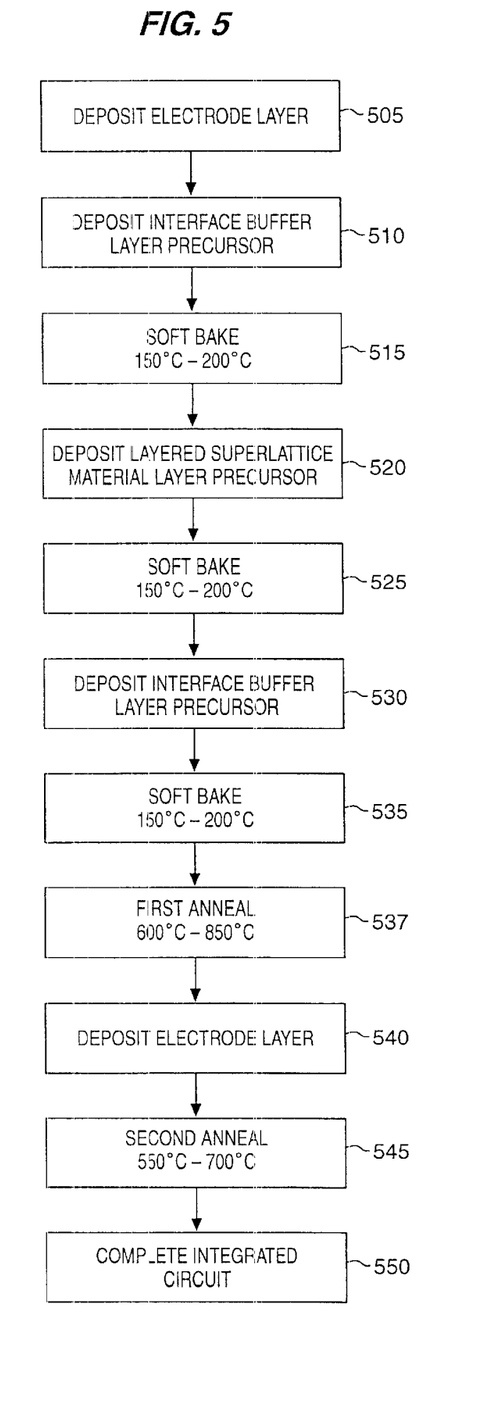
FIG. 5 is a flow diagram depicting the method for depositing an interface buffer layer and a thin film layered superlattice material layer according to a slow bake embodiment of the invention.
Figure 6:
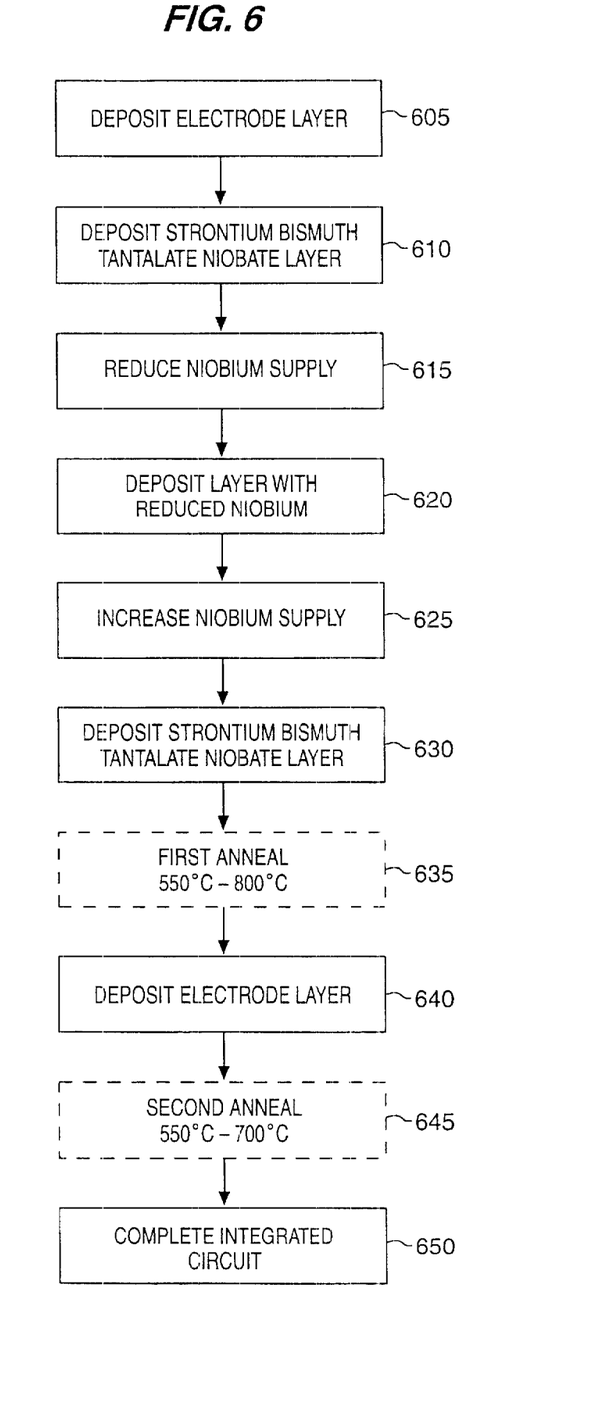
FIG. 6 is a flow diagram depicting the method for depositing an interface crystallization temperature embodiment of the invention.

FIG. 4 depicts a first method of making integrated circuit memory device 300. In FIGS. 4–6, the steps shown in dashed boxes are optional. In this first method, conventional methods that are well known in the art are applied to provide a semiconducting wafer 135. Next, an insulating layer 130 is formed, preferably by conventional methods, such as thermal oxidation of semiconducting wafer 135 or spin-on glass deposition. Next, bottom metal electrode 145 is formed in step 405, preferably by conventional sputtering processes. Once the bottom metal electrode 145 is deposited 405 then, if a lower buffer interface layer is desired, a source of A-site and B-site metals of a selected thin film layered superlattice material layer, such as strontium bismuth tantalate, is used to deposit 410 an oxide buffer layer 205 including the A-site and B-site materials. For example, if the layered superlattice material is strontium bismuth tantalate, the A and B oxide will be strontium tantalate. Preferably, the layered thin film superlattice material is selected from the group consisting of strontium bismuth tantalate, strontium bismuth niobate, strontium bismuth niobium tantalate, and bismuth lanthanum titanate. Thus, preferably the A and B oxide is selected from the group consisting of strontium tantalate, strontium niobate, strontium niobium tantalate, and lanthanum doped titanium oxide. The A and B oxide is preferably deposited 405 by sputtering or metalorganic chemical vapor deposition. Then, in step 415, a source of bismuth is switched on, thereby adding a source of bismuth to the source of A and B metals and a thin film 115 of the selected layered superlattice material is formed. Here, "switching on" includes turning a valve or switch to add fluid including the bismuth, directing a sputtering beam into a bismuth target, or any other process by which a bismuth source can be added to the A and B metal source. Once the thin film layered superlattice material layer 115 is formed, then the bismuth source supply is turned off or removed in step 420 and an upper interface buffer layer 120 of the A- and B-site, such as the oxide strontium tantalate, is deposited 425 adjacent to and on top of the thin film layered superlattice material layer 115, if the upper interface buffer layer is desired. Preferably, the upper interface buffer layer 120 is selected from the group consisting of strontium tantalate, strontium niobate, strontium tantalum niobate, and lanthanum doped titanium oxide. The wafer including the buffer layer 205, the thin film layered superlattice material layer 115, and the buffer layer 120 is subjected to an optional elevated temperature first anneal 427 to optimize the ferroelectric performance in the thin film layered superlattice material layer 115. These temperatures typically range from 600° C. to 850° C. Next, a top metal electrode 105 is formed in step 430, preferably by a conventional sputtering process. Then, again optionally, the integrated circuit memory device 100 is annealed 435 in a furnace at approximately 550° C. to 700° C. The integrated circuit is then completed in step 440 to include the buffer layers 205 and 120 and the layered superlattice material 115 as active layers in the integrated circuit device.

The method depicted in FIG. 4 may also be used to make integrated circuit memory device 100 by elimination of step 410 or to form memory device 200 by elimination of step 425.

A variation of the method depicted in FIG. 4 may also be used to make an integrated circuit memory device 300 in which the buffer layer is a simple oxide of either an A-site material or a B-site material. In this method, conventional methods that are well known in the art are applied to provide a semiconducting wafer 135. Next, an insulating layer 130 is formed, preferably by conventional methods, such as thermal oxidation of semiconducting wafer 135 or spin-on glass deposition. Next, bottom metal electrode 145 is formed in step 405, preferably by conventional sputtering processes. Once the bottom metal electrode 145 is deposited 405, then a source of either an A-site or a B-site metal of a selected thin film layered superlattice material layer, such as strontium bismuth tantalate, is used to deposit 410 an oxide buffer layer 205 including the A-site or B-site material. For example, if the layered superlattice material is strontium bismuth tantalate, the A or B oxide will be a strontium oxide or a tantalum oxide, such as tantalum pentoxide. Preferably, the layered thin film superlattice material is selected from the group consisting of strontium bismuth tantalate, strontium bismuth niobate, strontium bismuth niobium tantalate, bismuth titanate, and bismuth lanthanum titanate. Thus, preferably the A or B oxide is selected from the group consisting of a strontium oxide, a niobium oxide, a titanium oxide, or a tantalum oxide. The A or B oxide is preferably deposited 405 by sputtering or metalorganic chemical vapor deposition. It also may be doped with an element of the layered superlattice material 15. Then, in step 415, a source of bismuth and the other B- or A-site material is turned on or added to the source of A or B oxide and a thin film 115 of the selected layered superlattice material is formed. Once the thin film layered superlattice material layer 115 is formed, then the supplies of bismuth and the other B or A oxide is turned off or removed in step 420 and an upper interface buffer layer 120 of the A-or B-site, such as a strontium oxide or a tantalum oxide, is deposited 425 adjacent to and on top of the thin film layered superlattice material layer 115. Preferably, the upper interface buffer layer 120 is selected from the group consisting of a strontium oxide, a niobium oxide or a tantalum oxide. The wafer including the buffer layer 205, the thin film layered superlattice material layer 115, and the buffer layer 120 is subjected to an elevated temperature first anneal 427 to optimize the ferroelectric performance in the thin film layered superlattice material layer 115. These temperatures typically range from 600° C. to 850° C. Next, a top metal electrode 105 is formed, preferably by a conventional sputtering process. Then the integrated circuit memory device 100 is annealed 435 in a furnace at approximately 550° C. to 700° C. The integrated circuit is then completed in step 440 to include the buffer layers 205 and 120 and the layered superlattice material 115 as active layers in the integrated circuit device. Again, the steps of forming the lower and upper interface buffer layers are performed only if each layer is desired. As before, the anneal steps are optional.

The method just described may also be used to make integrated circuit memory device 100 by elimination of step 410 or to form memory device 200 by elimination of step 425.

FIG. 5 is an embodiment of a soft bake method whereby soft baking temperatures are utilized between deposition steps to produce an integrated circuit memory device. In this method, conventional methods that are well known in the art are preferably applied to provide a semiconducting wafer 135. Preferably, conventional methods, such as thermal oxidation of semiconducting wafer 135 or spin-on glass deposition, are used to form insulating layer 130. Conventional sputtering processes are preferably used to deposit 505 a bottom metal electrode 145. A lower interface buffer layer 205 is deposited 510 on top of the bottom metal electrode 145, preferably by misted deposition of spin-on techniques or other suitable method of liquid deposition. Preferably, the lower interface buffer layer 205 is selected from the group consisting of: 1) simple oxides, not including bismuth, of an A-site or a B-site metal; and 2) second layered superlattice materials different from the first layered superlattice material and containing at least one A-site or B-site metal that is the same as an A-site or B-site metal in the first layered superlattice material. Most preferably, the interface buffer layer is selected from the group consisting of strontium tantalate, bismuth tantalate, strontium niobium tantalate, strontium bismuth tantalate niobate, titanium oxide, and tantalum pentoxide, other simple oxides of A-site and B-site metals, and other simple oxides of one or more A-site or B-site metals. The buffer layer is formed 505 by coating the substrate with a liquid coating in the misted deposition or spin-on process, then the substrate is soft baked 515, preferably at an approximate temperature of 150° C. to 200° C. Then a thin film layered superlattice material layer 115 is deposited 520 on top of the lower interface buffer layer 205 by misted liquid deposition, by spin-on liquid deposition, or by any other suitable means of liquid deposition. Preferably, the layered thin film superlattice material is selected from the group consisting of strontium bismuth tantalate, strontium bismuth niobate, strontium bismuth niobium tantalate, bismuth titanate, and bismuth lanthanum titanate. Then the substrate is soft baked 525, preferably at an approximate temperature of 150° C. to 200° C. An upper interface buffer layer 120 is deposited 530 on top of the thin film layered superlattice material layer 115, preferably by a misted deposition, spin-on deposition or other liquid deposition process followed by a soft bake 535, preferably at an approximate temperature of 150° C. to 200° C. Preferably, the upper interface buffer layer 120 is selected from the group consisting of: 1) oxides of an A-site or a B-site metal; and 2) a second layered superlattice material 120, 205 different from the first layered superlattice material 115 and containing at least one A-site or B-site metal that is the same as an A-site or B-site metal in the first layered superlattice material 115. Most preferably, the interface buffer layer is selected from the group consisting of strontium tantalate, bismuth tantalate, strontium niobium tantalate, strontium bismuth tantalate niobate, titanium oxide, and tantalum pentoxide, other simple oxides of A-site and B-site metals, and other simple oxides of one or more A-site or B-site metals. The buffer layers 120 and 205 and the layered superlattice material layer 115 are then annealed, preferably at a temperature range from 600° C. to 850° C. The top metal electrode 105 is then deposited 540 on top of the thin film layered superlattice material layer 115 and the integrated circuit memory device 100 is annealed 545 in a furnace at approximately 550° C. to 700° C. The integrated circuit is then completed in step 550 to include the buffer layers 205 and 120 and the layered superlattice material 115 as active layers in the integrated circuit device. The method just described may also be used to make integrated circuit memory device 100 by elimination of steps 510 and 515 or to form memory device 200 by elimination of steps 530 and 535.

As shown in FIG. 6, a variation of the method of FIG. 4 may be used to form an integrated circuit 100, 200, or 300 in which the buffer layer or layers is a layered superlattice material different than the layered superlattice material 115 but sharing at least one A-site or B-site material with the layered superlattice material 115. As indicated above, the steps shown in boxes with dashed outlines in FIG. 6 are optional. The method of FIG. 6 is the same as the first method described above in connection with FIG. 4, except that instead of just the A and B sources, a source of bismuth is also used. For example, in step 605, an electrode layer 125 is deposited as discussed above. Then, for example, if a lower buffer layer is desired, in step 610, a strontium source, a tantalum source, and a niobium source may be used in combination with a bismuth source to form a strontium bismuth tantalum niobate layer 205. Then, in a step 615 analogous to step 415, the niobium source may be reduced, removed, turned down or turned off to form, in step 620, a layer 115, with reduced niobium content. This layer may be strontium bismuth tantalate or strontium bismuth tantalum niobate in which the amount of niobium is less than in the buffer layer. Then, if an upper buffer layer is desired, in a step 625 analogous to step 420, the niobium source is turned up, turned back on or added to form a strontium niobium bismuth tantalate layer 120 in step 630. In this layer 120, the concentration of niobium is higher than the concentration of niobium in the layered superlattice material layer 115. The wafer including the buffer layer 205, the thin film layered superlattice material layer 115, and the buffer layer 120 is then optionally subjected to an elevated temperature first anneal 635 to optimize the ferroelectric performance in the thin film layered superlattice material layer 115. These temperatures typically range from 600° C. to 850° C. Next, a top metal electrode 105 is formed in step 640, preferably by a conventional sputtering process. Then, optionally, the integrated circuit memory device 100 is annealed 645 in a furnace at approximately 550° C. to 700° C. The integrated circuit is then completed in step 650 to include the buffer layers 205 and 120 and the layered superlattice material 115 as active layers in the integrated circuit device.

In the process just described, the layered superlattice material 115 is preferably strontium bismuth tantalate or strontium bismuth tantalum niobate and the buffer layer 120 and/or 205 is preferably strontium tantalum bismuth niobate having a higher concentration of niobium than the layer 115. This process provides a lower temperature first anneal step 635. That is, presumably because strontium bismuth niobate has a lower crystallization temperature than strontium bismuth tantalate, and because the more niobium that is added to strontium bismuth tantalum niobate the lower the temperature at which a layered superlattice material will form, the use of buffer layers of strontium bismuth tantalum niobate with higher concentrations of niobium than the layered superlattice material 115 has been found to lower the first anneal temperature by about 50° C. Such a lowering of the first anneal temperature increases the yield of good memories by about 10% because of less degradation of the MOSFET devices in the circuit.

Similar to the process shown in FIG. 6, other second layered superlattice materials may be used as buffer layers 120 and/or 205 and other first layered superlattice materials may be used as layered superlattice material 115, with the only requirement being that the first and second layered superlattice materials are different layered superlattice materials.

All of the components of device 100, device 200, and device 300, except interface buffer layers 120 and 205 and layered superlattice material 115, are preferably made according to known methods. These conventional methods are well known in the art and include, for example, thermal oxidation of semiconducting wafer 135 to yield insulating layer 130 or spin-on glass deposition of layer 130 with a substantially similar result. Conventional sputtering processes are preferably used to deposit bottom electrode 145 and top electrode 105. Conventional resist etching techniques are preferably used to pattern the devices for their inclusion in integrated circuits. These processes are not critical to the invention. For example, substrate 135 is alternatively a stacked integrated circuit structure resulting from conventional CMOS processes.

There has been described a method for fabricating an integrated circuit having an interface buffer layer. It should be understood that the particular embodiments shown in the drawings and described within this specification are for purposes of example and should not be construed to limit the invention which will be described in the claims below. For example, the invention contemplates that additional process steps and layers may be included. For example, barrier layers and/or adhesion layers may be included in electrodes or buffer layers. In some cases, the process steps may take place in a different order. Similarly, the invention may be applied to any ferroelectric integrated circuit device having an electrode and a ferroelectric layer, such as a ferroelectric FET or other devices.

What is claimed is:

1. An integrated circuit device including a substrate supporting a first thin film layered superlattice material layer and an electrode, comprising an interface buffer layer interposed between said thin film layered superlattice material layer and said electrode, said interface buffer layer selected from the group consisting of: simple oxides of an A-site or a B-site metal, said simple oxide of an A-site or B-site metal not including an oxide of bismuth; and a second layered superlattice material different from said first layered superlattice material and containing at least one A-site or B-site metal that is the same as an A-site or B-site metal in said first layered superlattice material.

2. An integrated circuit as in claim 1 wherein said interface buffer layer is selected from the group consisting of: strontium tantalate, bismuth tantalate, strontium niobium tantalate, strontium bismuth tantalate niobate, titanium oxide, and tantalum pentoxide, other simple oxides of A-site and B-site metals, and other simple oxides of one or more A-site or B-site metals.

3. An integrated circuit as in claim 2, wherein said interface buffer layer further includes a dopant.

4. An integrated circuit as in claim 3 wherein said dopant comprises a metal that is the same as a superlattice generator metal in said thin film layered superlattice material.

5. An integrated circuit device as in claim 1 wherein said thin film layered superlattice material layer comprises bismuth.

6. An integrated circuit device as in claim 5 wherein said thin film layered superlattice material layer comprises a material selected from the group consisting of strontium bismuth tantalate, strontium bismuth niobate, strontium bismuth niobium tantalate, bismuth titanate, and bismuth lanthanum titanate.

7. An integrated circuit device as in claim 1 wherein said electrode is a top electrode, said top electrode being remote from said substrate relative to said thin film layered superlattice material layer.

8. An integrated circuit device as in claim 7 and including a bottom electrode interposed between said thin film layered superlattice material layer and said substrate.

9. An integrated circuit device as in claim 1 wherein said interface buffer layer comprises strontium tantalate.

10. An integrated circuit device as in claim 1 wherein said interface buffer layer comprises bismuth tantalate.

11. An integrated circuit device as in claim 1 wherein said interface buffer layer comprises strontium niobium tantalate.

12. An integrated circuit device as in claim 11 wherein said layered superlattice material comprises strontium bismuth niobium tantalate.

13. An integrated circuit device as in claim 1 wherein said interface buffer layer comprises strontium bismuth tantalum niobate.

14. An integrated circuit device as in claim 13 wherein said first layered superlattice material comprises strontium bismuth tantalate.

15. An integrated circuit device as in claim 1 wherein said interface buffer layer comprises tantalum pentoxide.

16. An integrated circuit device as in claim 1 wherein said interface buffer layer comprises titanium oxide and said thin film layered superlattice material comprises bismuth titanate.

17. An integrated circuit device as in claim 1 wherein said interface buffer layer comprises lanthanum doped titanium oxide and said thin film layered superlattice material comprises bismuth lanthanum titanate.

18. An integrated circuit device as in claim 1 wherein said electrode is a bottom electrode, said bottom electrode being interposed between said first thin film layered superlattice material layer and said substrate.

19. An integrated circuit device as in claim 1 wherein said interface buffer layer has a thickness ranging from 3 nm to 30 nm.

20. An integrated circuit device as in claim 19 wherein said interface buffer layer has a thickness ranging from 5 nm to 20 nm.

21. An integrated circuit device as in claim 1 wherein said integrated circuit is an electronic memory.

22. An integrated circuit device as in claim 1 wherein said device comprises a capacitor.

23. An integrated circuit device as in claim 1 wherein said device comprises a ferroelectric FET.

24. An integrated circuit device as in claim 1 wherein said first layered superlattice material comprises strontium bismuth tantalum niobate or strontium bismuth tantalate, and said second layered superlattice material comprises strontium bismuth tantalum niobate in which the amount of niobium exceeds the amount of niobium in said first layered superlattice material.

* * * * *